(12) United States Patent
Hibbs

(10) Patent No.: US 7,061,590 B2
(45) Date of Patent: *Jun. 13, 2006

(54) PELLICLE DISTORTION REDUCTION

(75) Inventor: Michael S. Hibbs, Westford, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/737,046

(22) Filed: Dec. 16, 2003

(65) Prior Publication Data
US 2004/0125354 A1  Jul. 1, 2004

Related U.S. Application Data

(63) Continuation of application No. 09/683,748, filed on Feb. 11, 2002, now Pat. No. 6,731,378.

(51) Int. Cl.
G03B 27/62 (2006.01)
G03B 27/58 (2006.01)

(52) U.S. Cl. .......................... 355/75; 355/72

(58) Field of Classification Search .............. 355/30, 355/72–76; 310/10, 12; 378/34, 35; 430/5, 430/20, 22, 30
See application file for complete search history.

(56) References Cited

U.S. PATENT DOCUMENTS

| | | | |
|---|---|---|---|
| 3,945,677 A * | 3/1976 | Servais et al. | 296/180.2 |
| 4,245,862 A * | 1/1981 | Buckley, Jr. | 296/180.3 |
| 6,055,040 A * | 4/2000 | Sego | 355/76 |
| 6,524,754 B1 * | 2/2003 | Eynon | 430/5 |
| 6,710,845 B1 * | 3/2004 | Wu et al. | 355/30 |
| 6,788,392 B1 * | 9/2004 | Nakano | 355/72 |
| 6,791,661 B1 * | 9/2004 | Sato | 355/30 |
| 2003/0016338 A1 * | 1/2003 | Yasuda et al. | 355/55 |

* cited by examiner

Primary Examiner—Henry Hung Nguyen
(74) Attorney, Agent, or Firm—Richard M. Kotulak; Hoffman, Warnick & D'Alessandro LLC (57) ABSTRACT

The invention provides systems and a method for reducing pellicle distortion. One feature of the invention reduces distortion of a pellicle by providing an airtight mounting structure for coupling a pellicle to a mask; and a port on the mounting structure though which a pressure difference can be created between the interior portion and an exterior environment. Hence, distortion can be reduced by controlling the pressure in the interior portion between the pellicle, the pellicle mounting structure and the mask. Another feature places an aerodynamic fairing adjacent the mask to reduce aerodynamic drag and, hence, suppress turbulent air flow over the pellicle. The features can be used separately or in combination.

10 Claims, 5 Drawing Sheets

PELLICLE DISTORTION REDUCTION

This application is a continuation of U.S. application Ser. No. 09/683,748, filed Feb. 11, 2002, U.S. Pat. No. 6,731,378.

BACKGROUND OF THE INVENTION

1. Technical Field

The present invention relates generally to pellicles used to protect a mask and, more particularly, to pellicle distortion reduction.

2. Related Art

Pellicles are thin, optically transparent membranes that are used in photolithography to protect patterned photomask surfaces from contamination by airborne particles. The pellicles are conventionally attached to the photomask by a metal frame. Conventional pellicles are made of organic or fluorocarbon polymers. Conventional pellicles are so thin (approximately 0.5 to 2.0 microns) that they do not introduce any appreciable optical distortion to the light passing through them, even if the pellicle is physically distorted from an ideal flat shape.

An emerging photolithography technique is the use of a 157 nanometer (nm) exposure wavelength. Current pellicle technology used at 365 nm, 248 nm, and 193 nm exposure wavelengths are either not transparent enough or not durable enough for the radiation exposure used at the 157 nm exposure wavelength. Unfortunately, no polymers have been found with sufficient radiation durability to be used as pellicles at the 157 nm exposure wavelength. For this reason, thick or hard plate pellicles have been proposed for use at this exposure wavelength. A thick plate pellicle may include a flat, polished piece of fused silica, typically 100 to 1000 microns thick. A drawback of these thicker pellicles is that optical distortions can be induced in the light passing through them more readily than with thinner pellicles. In particular, any bending of a thick plate pellicle will induce severe displacements of the images being transmitted.

Figure 1:
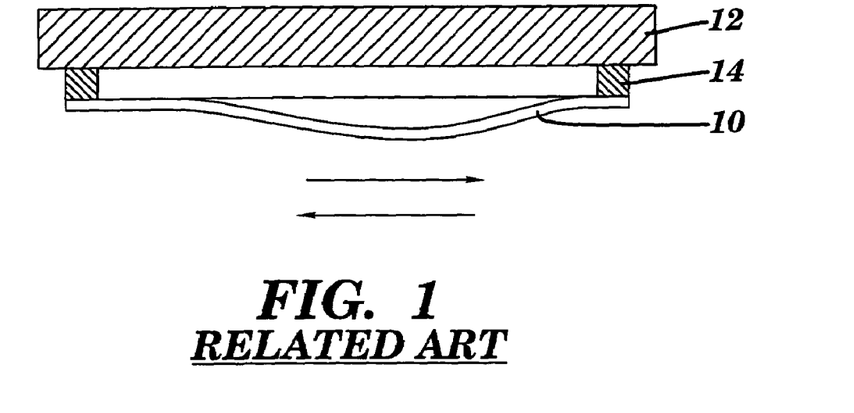
FIG. 1 shows a cross-sectional view of a related art pellicle and mask.
Figure 2:
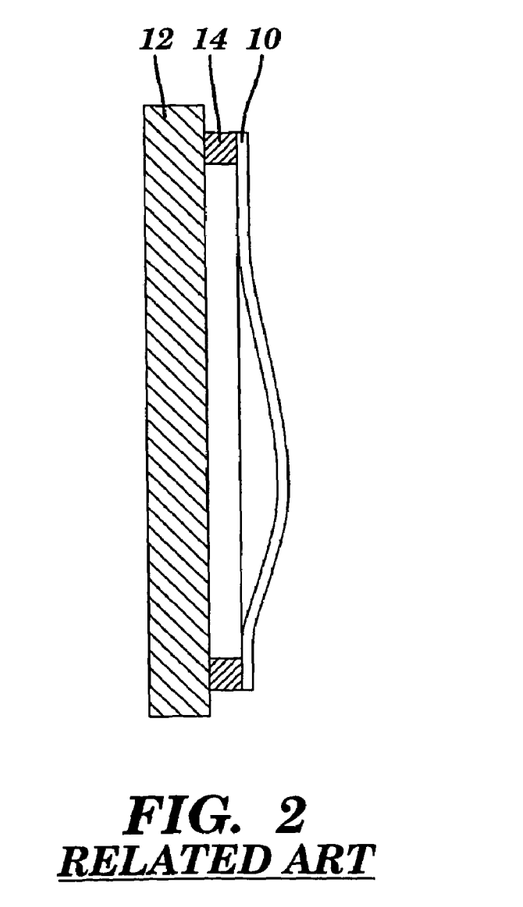
FIG. 2 shows a cross-sectional view of a related art pellicle and mask that is mounted substantially vertical.

Distortion of a pellicle can be provoked by three general causes: gravity, aerodynamic turbulence caused by movement, and forces exerted during acceleration. FIG. 1 illustrates a pellicle 10 coupled to a mask 12 by a pellicle mounting frame 14. As shown, gravity causes the pellicle to sag, which introduces optical distortion to the mask pattern. This sag occurs regardless of whether the pellicle is below the mask, as shown, or above the mask. Sag also occurs when the pellicle and mask are supported substantially vertically, as shown in FIG. 2.

With regard to aerodynamic turbulence, almost all modern lithographic exposure tools use the "step-and-scan" exposure method in which the mask and wafer are scanned at high speed during the exposure. The direction of movement is shown in FIGS. 1 and 2 by the arrows. Mask speeds can reach, for example, over 2 meters per second in a direction parallel to the mask surface. At these speeds, turbulent air flow is likely to be induced by the edges of the mask and the pellicle mounting frame. This turbulent flow can make the pellicle flutter sufficiently to induce image distortions during the exposure. In addition, forces exerted during acceleration during the "step-and-scan" exposure method can make the pellicle flutter and induce image distortion.

A number of remedies to the above-identified problems have been offered. One suggestion is to increase the pellicle stiffness by thickening to reduce the sag and movement in response to turbulence. Thick plate pellicles were originally proposed to be between 100 and 200 microns thick, but the stiffness requirements have pushed the needed thickness to the 300–800 micron range. A number of problems result from this thickening. First, pellicles thicker than approximately 200 microns induce spherical aberrations in the lithographic optics requiring correction, which adds complexity and/or costs. With these corrections built into the optics, a mask without the correct pellicle thickness, or with no pellicle, cannot be used in the same tool. This is disadvantageous because it is often desirable to use test masks without pellicles due to cost, turnaround time, and ease of handling. In addition, reticles used for tool calibration or setup, which do not have any requirements for low defect density, often are used with no pellicles. The requirement to use a pellicle in a tool which is pre-compensated for a particular pellicle thickness therefore increases the cost of test, calibration, setup, and experimental masks used with the tool. In addition, when spherical aberration corrections are added to the optics, the thick pellicle must also be built to tolerances similar to those of a lithographic lens element, since it must introduce the precise amount of spherical aberration that was corrected in the optics. This adds further cost. Consequently, thickening of the pellicle is not a sufficient remedy.

Another proposal is to use a removable pellicle, or no pellicle, and maintain control of particles to an extreme level in the tool and/or in-situ mask cleaning in the tool. Unfortunately, increased control also means increased costs, maintenance and time consumption. Accordingly, this proposal has not been widely embraced.

In view of the foregoing, there is a need a way to provide reduced pellicle distortion. It would be advantageous if the solution was applicable to both thin and thick pellicles.

SUMMARY OF THE INVENTION

One feature of the invention reduces distortion of a pellicle by controlling the pressure in the interior portion between the pellicle, the pellicle mounting structure and the mask. Another feature reduces aerodynamic drag and, hence, suppresses turbulent air flow over the pellicle.

A first aspect of the invention is directed to a mounting system for a pellicle comprising: a mounting structure for coupling a pellicle to a mask, wherein a sealed interior portion is formed between the pellicle, the mask and the mounting structure; and a port on the mounting structure through which a pressure difference can be created between the interior portion and an exterior environment.

A second aspect of the invention is directed to a pellicle mounting system for a mask, the mounting system comprising: an aerodynamic fairing adjacent the mask, the fairing having a taper to reduce aerodynamic drag on the pellicle.

A third aspect of the invention is directed to a method of reducing distortion of a pellicle for a mask, the method comprising the steps of: sealing the pellicle to the mask using an airtight mounting structure such that an interior portion is created between the pellicle, the mask and the mounting structure; and regulating the pressure in the interior portion to maintain a flat surface on the pellicle.

The foregoing and other features and advantages of the invention will be apparent from the following more particular description of preferred embodiments of the invention.

BRIEF DESCRIPTION OF THE DRAWINGS

The preferred embodiments of this invention will be described in detail, with reference to the following figures, wherein like designations denote like elements, and wherein.

It is noted that the drawings of the invention are not to scale. The drawings are intended to depict only typical embodiments of the invention, and therefore should not be considered as limiting the scope of the invention.

DETAILED DESCRIPTION OF THE INVENTION

Figure 3:
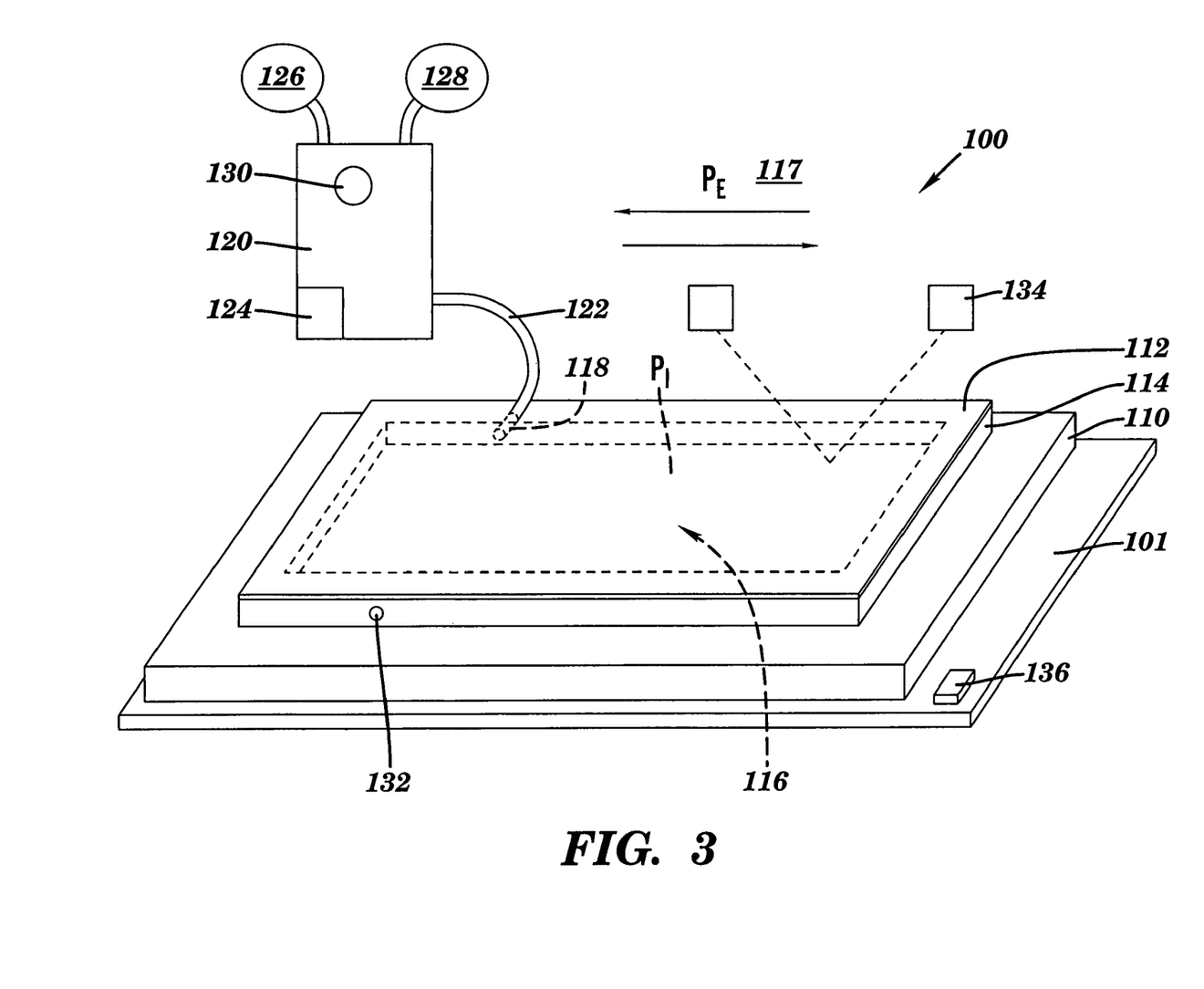
FIG. 3 shows a perspective view of a pellicle mounting system according to a first embodiment of the invention.

Referring to FIG. 3, a first embodiment of the invention is illustrated. In this embodiment, a mounting system 100 for mounting a pellicle 112 to a mask 110 is shown. Mounting system 100 may couple to a scanned exposure system (not shown) by a stage 101. Mounting system 100 includes a mounting structure 114 for coupling pellicle 112 to mask 110. Mounting structure 114 couples pellicle 112 to mask 110 in a sealed fashion. The seal may be formed in any well known fashion, for example, using adhesives. As a result, a sealed interior portion 116 is formed between pellicle 112, mask 110 and mounting structure 114. A port 118 is provided on mounting structure 114 though which a pressure difference can be created between interior portion 116 and an exterior environment 117. The pressure of the interior portion is indicated as $P_I$ and the pressure of exterior environment 117 as $P_E$.

The pressure difference ($P_E$–$P_I$) is controlled to maintain a flat surface on pellicle 112. The pressure difference can be controlled in a number of ways. In one embodiment, a pressure regulator 120 is placed in communication with port 118 to control the pressure in interior portion 116. Fluid communication can be made between regulator 120 and port 118 by a tube 122 or any other well known mechanism. Pressure regulator 120 may include a pressure sensor 124 to detect the differential pressure between interior portion 116 and exterior environment 117.

Pressure $P_I$ in interior portion 116 may be controlled by pressure regulator 120 in a variety of ways. In one embodiment, pressure regulator 120 may be coupled to a source of high pressure gas 126 and a source of low pressure gas 128. The gas can be air or another gas. A valve system 130 of pressure regulator 120 can then regulate the pressure $P_I$ accordingly. That is, when valve system 130 opens to high pressure source 126, gas enters interior portion 116 and pressure $P_I$ increases. When valve system 130 opens to low pressure source 128, gas from interior portion 116 escapes and pressure $P_I$ decreases. Valve system 130 may include one or more valves. Operation of valve system 130 can be controlled according to feedback from pressure sensor 124, that is valve system 130 can be controlled to open or close communication to high and low pressure gas sources 126, 128 until the desired pressure is sensed by pressure sensor 124. Pressure $P_I$ can be controlled to have any value between that of high pressure source 126 and low pressure source 128.

In a second embodiment, pressure regulator 120 may have one of the pressure gas sources 126, 128 provided as exterior environment 117. In order to accomplish this, a calibrated leak 132 to exterior environment 117 can be provided. In this case, pressure $P_I$ can be controlled between the pressure of the remaining gas source and exterior environment 117 pressure $P_E$. Calibrated leak 132 may be provided by a deliberately designed aperture. Alternatively, natural leaks and the permeability of pellicle 112 and mounting structure 114 may provide this function. While calibrated leak 132 is shown on mounting structure 114, it may also be provided as part of pressure regulator structure 120 or at any other convenient location.

In any event, interior portion 116 may be in continuous communication with one or more pressure sources 126, 128 or exterior environment 117 as required.

In operation, pressure $P_I$ is controlled to maintain a flat surface in pellicle 112 by counterbalancing forces that distort pellicle 112, e.g., gravitational and aerodynamic forces. For instance, in the case of gravity for a pellicle facing upward (as shown in FIG. 3), a pressure $P_I$ slightly higher than pressure $P_E$ of exterior environment 117 will be required. In contrast, for a pellicle facing downward (as shown in FIG. 1), a pressure $P_I$ slightly below pressure $P_E$ of exterior environment 117 will be required. An optimal pressure difference may be mathematically calculated by pressure regulator 120 taking into consideration the relevant forces. For example, relative to gravity, the optimal pressure difference can be calculated according to the areal density of pellicle 112: a pellicle made of fused silica (density 2.202 $g/cm^3$), with a thickness of 300 microns, will have a mass density per unit area of 0.066 $g/cm^2$. Assuming the pellicle is below the mask, this mass can be supported against gravitational sag by a negative pressure of 0.66 mm $H_2O$, equal to 0.026" $H_2O$ in interior portion 116. This negative pressure is the differential pressure between the gas inside interior portion 116 ($P_I$) and the exterior environment 117 ($P_E$).

If forces are relatively constant, the pressure difference can be maintained at a constant value. Alternatively, pressure can be dynamically adjusted to reduce the amount of distortion. One way of accomplishing this is to provide a feedback system including a position sensor 134 to detect the position of pellicle 112 so that the flatness of the pellicle can be maintained. In this case, the sensor may take any of a number of forms. As shown in FIG. 3, position sensor 134 is in the form of a reflected laser beam including, for example, a transmitter and a receiver. It may also be provided as a capacitive sensor, a mechanical linkage, or any other now known or later developed position sensor. The signal from position sensor 134 is fed to pressure regulator 120 so that pressure can be dynamically adjusted to reduce the amount of distortion as much as possible. The position of position sensor 134 and the number of position sensors can be adjusted to provide optimal performance based on the particulars of mounting system 100. In addition, pressure sensor 124 and position sensor 134 may be used alone or in combination.

Another embodiment for dynamically adjusting pressure to reduce the amount of distortion may include a feedback system having a velocity sensor 136 mounted to, for example, stage 101. Velocity sensor 136 may take a variety of forms. For instance, velocity sensor 136 may be a hot wire anemometer, a velocity calculator incorporated as part of an interferometer controller for stage 101, or any other now known or later developed device. In this setting, readings from velocity sensor 136 are fed back to pressure regulator 120 and pressure adjusted according to mathematical calculations that determine expected distortion versus velocity of pellicle 112. The calculations can consider gravity, acceleration and aerodynamic forces. The position of velocity sensor 136 and the number of velocity sensors can be adjusted to provide optimal performance based on the particulars of mounting system 100. In addition, pressure sensor 124, position sensor 134 and velocity sensor 136 may be used alone or in combination.

Figure 4:
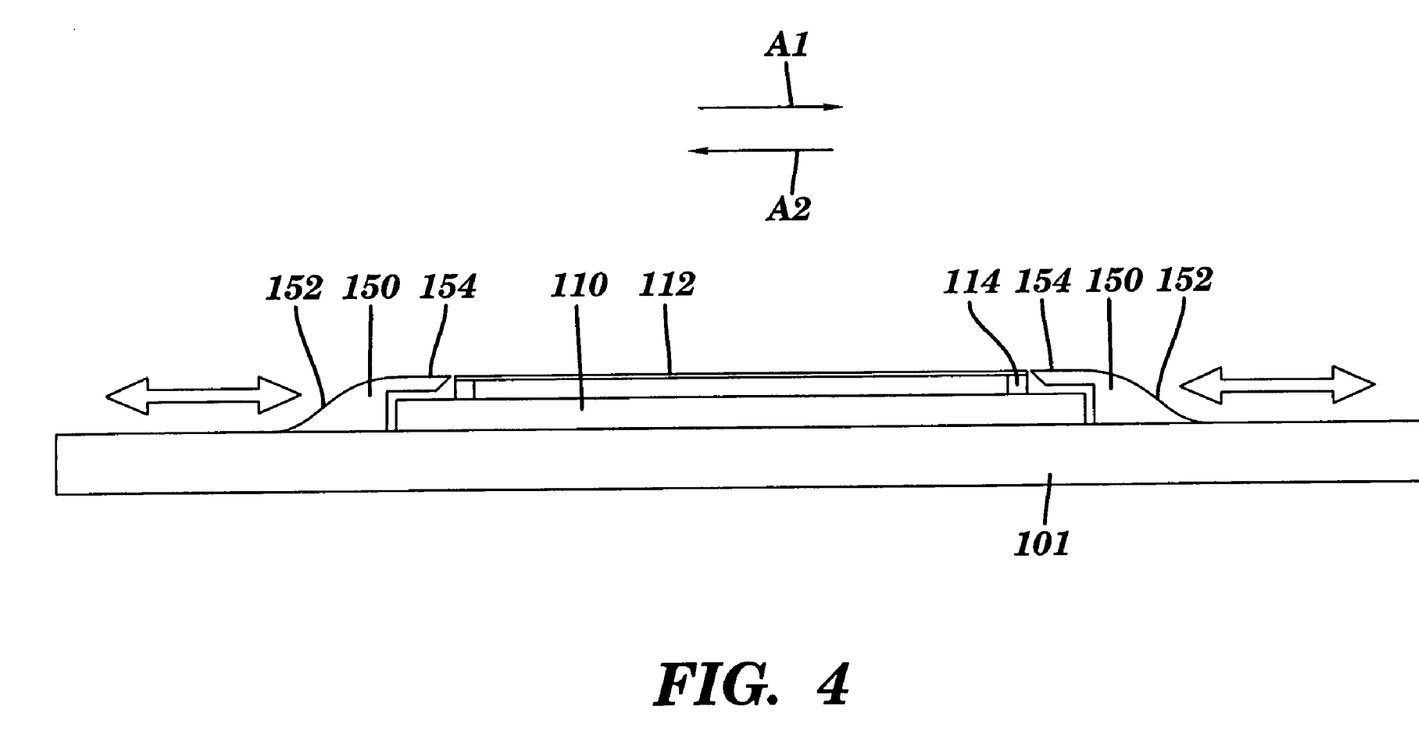
FIG. 4 shows a cross-sectional view of a pellicle mounting system according to a second embodiment of the invention.
Figure 5:
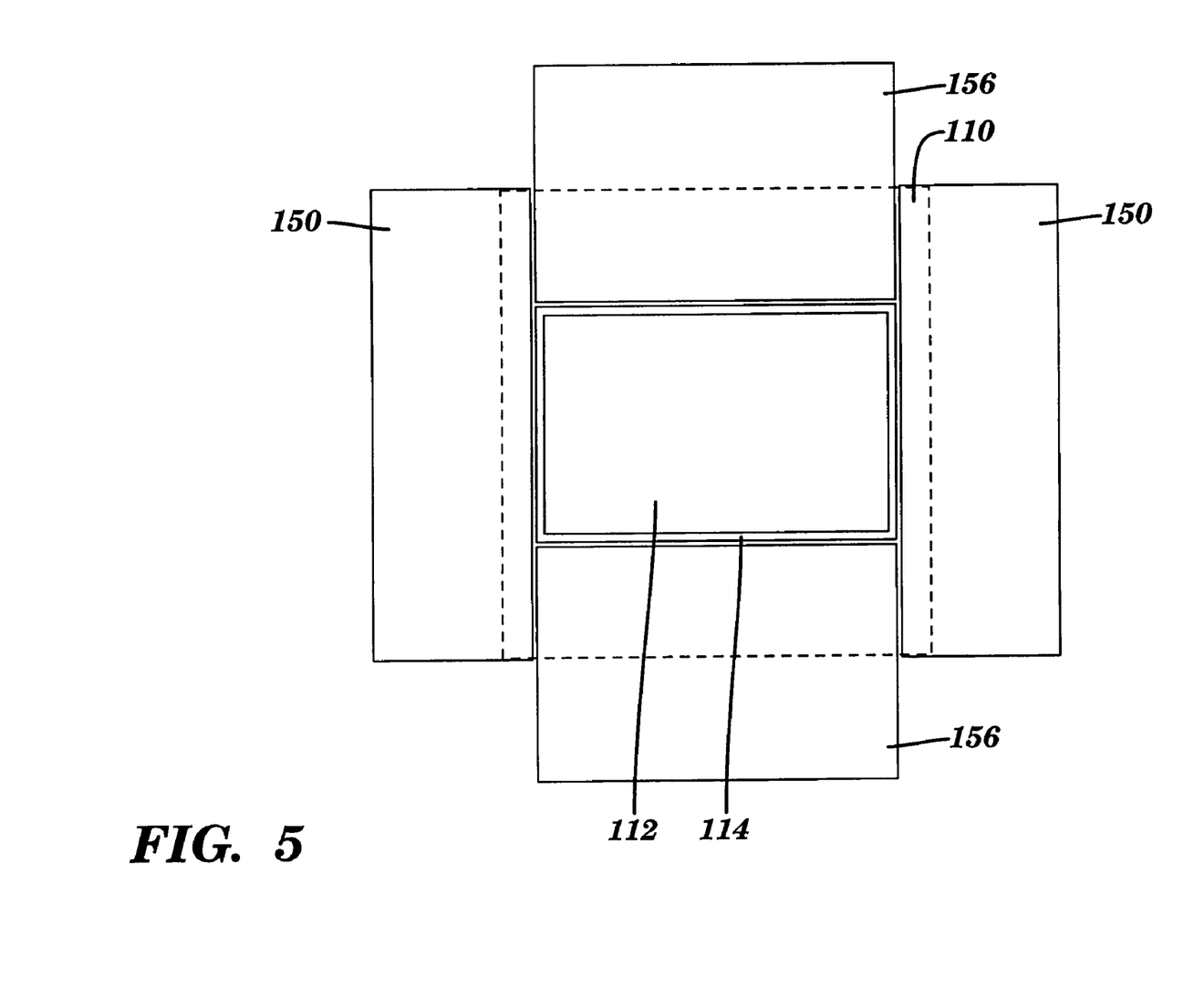
FIG. 5 shows a plan view of the pellicle mounting system of FIG. 4.
Figure 6:
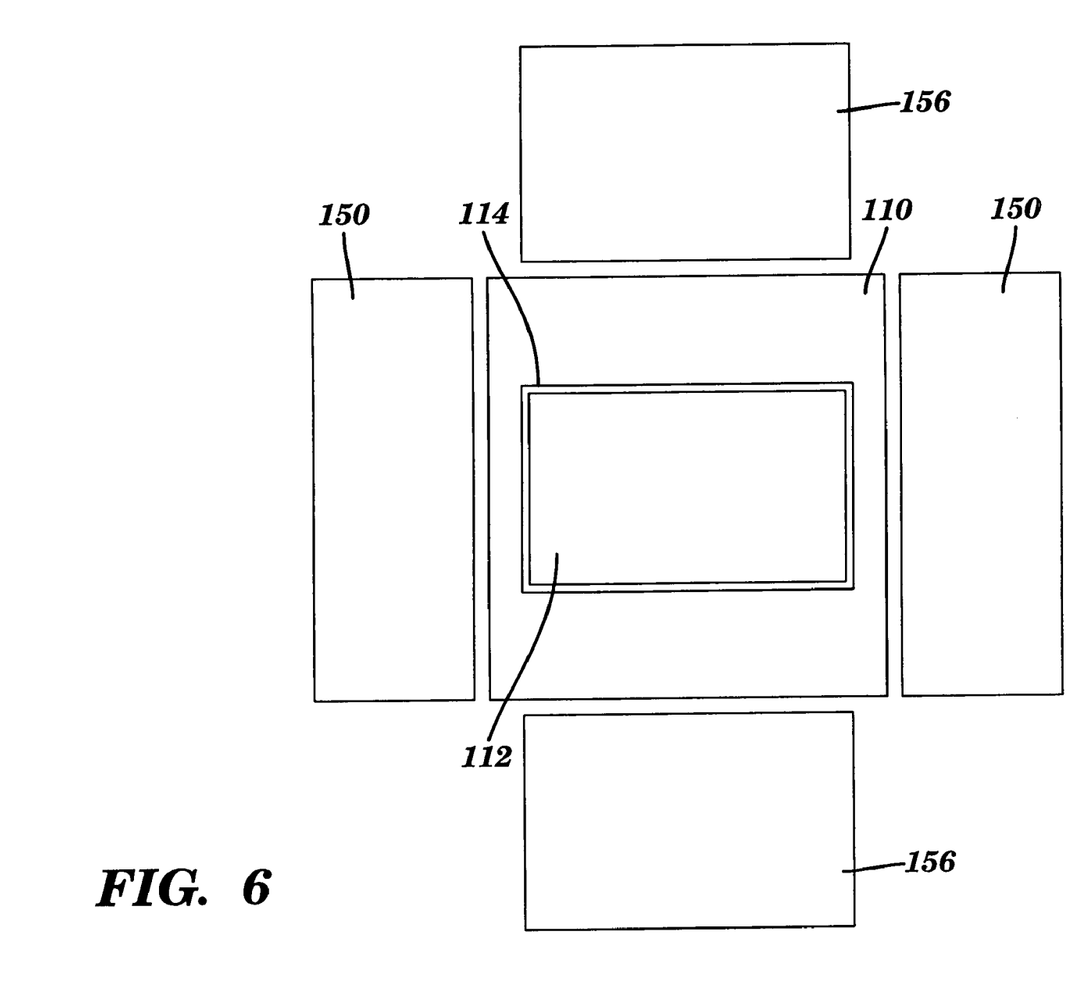
FIG. 6 shows a plan view of the pellicle mounting system of FIG. 4 in a separated position.

Referring to FIGS. 4–6, a second embodiment of the invention, which can be used alone or in combination with the first embodiment, is illustrated. In this embodiment, an aerodynamic fairing 150 is provided adjacent mounting structure 114. In one embodiment, an aerodynamic fairing 150 is provided on each end of mounting structure 114 that faces a direction of movement (indicated by arrows A1 and A2 in FIG. 4) in the step-and-scan exposure tool. That is, a leading and a trailing edge of mounting structure 114 each may include a fairing 150. Each aerodynamic fairing 150 includes a taper 152, a portion 154 that covers an edge of mask 110 and is co-planar with pellicle 112, and a curved surface therebetween. In one embodiment, taper 152 extends smoothly away from the plane of pellicle 112 to a point at or below the surface of mask 110. As also shown in FIG. 4, aerodynamic fairing 150 exposes the whole surface of pellicle 112.

As shown in FIGS. 4 and 5, aerodynamic fairing 150 may be removable or retractable to assist in coupling mask 110 to stage 101. As shown in FIG. 6, this is accomplished by each fairing 150 being removable or retractable from stage 101 to a separated position. A fairing 150 may be retractable, for example, by coupling it to a movable mount (not shown) that allows it to be separated for mounting or demounting mask 110 to stage 101. Optionally, as shown in FIGS. 5 and 6, one or more retractable plates 156 may also be provided to provide a substantially continuous surface between fairings 150. Plates 156 are provided on sides that do not face a direction of movement to stage 101. After a mask 110 has been mounted to stage 101, each fairing 150 is brought into close proximity with mounting structure 114, e.g., less than 1 mm from the mounting structure. If provided, plates 156 are also brought into close proximity with mounting structure 114 and each fairing 150.

In operation, stage 101, mask 110, pellicle 112 and mounting structure 114 are moved during exposure/scanning, in the directions of the arrows A1 and A2 (FIG. 4). By using one or more aerodynamic fairings, taper 152 of each fairing reduces aerodynamic drag and turbulence on pellicle 112 and, hence, reduces pellicle distortion.

The high-speed laminar flow across pellicle 112, however, may induce pressure changes over the pellicle due to the Bernoulli effect, which may cause distortion in the pellicle. However, these pressure changes will be relatively uniform across mask 110 and can be compensated by a pressure difference in interior portion 116, as discussed above. In one embodiment, the magnitude of the Bernoulli forces as a function of scanning speed can be calculated and pressure $P_I$ dynamically adjusted by pressure regulator 120 to compensate for these forces. In this case, stage 101 speed, i.e., pellicle speed, will be monitored and a computer or microprocessor (possibly part of pressure regulator 120) will use this input to calculate the pressure difference required to maintain the flatness of pellicle 112. If the scanning speed changes, a new pressure $P_I$ can be calculated and applied to interior portion 116. In another embodiment, a programmed variation of pressure $P_I$ versus time can be calculated. The pressure difference is then calculated to compensate for the varying aerodynamic forces on pellicle 112 throughout the scanning period and in the stationary periods between scans. This calculation may also take into consideration other forces acting on pellicle 112, e.g., gravitational forces, as discussed above. As an alternative to the above calculations, pressure $P_I$ can be actively controlled by a feedback system using a position sensor 134, as discussed above, to detect distortions in pellicle 112.

It should be recognized that certain aspects of pressure regulation described above may be omitted depending on the particulars of mounting system 100. For example, in the case of a scanned exposure system in which mask 110 and pellicle 112 are mounted substantially vertical, pressure regulation for gravitational forces may be omitted.

The invention also includes a method of reducing distortion of a pellicle for a mask. The method includes the steps of: sealing pellicle 112 to mask 110 using airtight mounting structure 114 such that interior portion 116 is created between the pellicle, the mask and the mounting structure; and regulating the pressure $P_I$ in the interior portion to maintain a flat surface on the pellicle. The method may also include the step of providing an aerodynamic fairing adjacent mask 110 to reduce turbulent airflow across pellicle 112. Furthermore, pressure $P_I$ may be regulated according to feedback from at least one of a pressure sensor 124 coupled to interior portion 116 and position sensor 134 for pellicle 112.

In view of the foregoing, pellicle distortion can be reduced by controlling the pressure in the interior portion between the pellicle, the pellicle mounting structure and the mask, and by placing an aerodynamic fairing adjacent the mask to reduce aerodynamic drag and, hence, suppress turbulent air flow over the pellicle. It should be recognized that while the invention finds its greatest advantage with thick pellicles, the teachings of the invention are applicable to any pellicle regardless of thickness.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims. For instance, while particular mechanisms for regulating pressure have been disclosed, pressure control can be provided by any now known or later developed systems.

What is claimed is:

1. A mounting system for a pellicle comprising:
    a mounting structure for coupling a pellicle to a mask, wherein a sealed interior portion is formed between the pellicle, the mask and the mounting structure;
    a pressure regulator in communication with the sealed interior portion to control a pressure in the interior portion, wherein the pressure regulator is coupled to a device for measuring the pressure in the interior portion; and
    a velocity sensor operatively coupled to the pressure regulator to determine the velocity of the pellicle, wherein a pressure difference between the interior portion and an exterior environment is controlled by the pressure regulator to maintain a flat surface on the pellicle based on a reading from the velocity sensor.

2. The mounting system of claim 1, further comprising a source of high pressure gas coupled to the pressure regulator, and a source of low pressure gas coupled to the pressure regulator.

3. The mounting system of claim 2, wherein one of the sources of pressure gas is the exterior environment.

4. The mounting system of claim 1, further comprising a pressure sensor operatively coupled to the pressure regulator for detecting a pressure of the interior portion.

5. The mounting system of claim 1, further comprising a position sensor operatively coupled to the pressure regulator to determine the position of the pellicle;
   wherein the pressure difference is controlled by the pressure regulator to maintain a flat surface on the pellicle based on a reading from the position sensor.

6. The mounting system of claim 1, further comprising a calibrated leak from the interior portion to an exterior environment.

7. The mounting system of claim 1, further comprising an aerodynamic fairing adjacent the mounting structure.

8. The mounting system of claim 1, wherein the pressure regulator communicates with the sealed interior portion through a port in the mounting structure.

9. A pellicle mounting system for a mask, the mounting system comprising:
   an aerodynamic fairing adjacent the mask, the fairing having a portion that is co-planar with the pellicle and a curved taper extending from the portion to a stage to reduce aerodynamic drag on the pellicle;
   a mounting structure for coupling the pellicle to the mask, wherein a sealed interior portion is formed between the pellicle, the mask and the mounting structure;
   a pressure regulator to adjust a pressure in the interior portion; and
   a position sensor operatively coupled to the pressure regulator to determine the position of the pellicle,
   wherein a pressure difference between the interior portion and an exterior environment is controlled by the pressure regulator to maintain a flat surface on the pellicle based on a reading from the position sensor.

10. The mounting system of claim 9, further comprising a velocity sensor operatively coupled to the pressure regulator to determine the velocity of the pellicle.

* * * * *

Disclaimer

7,061,590 B2 — Michael S. Hibbs, Westford, VT (US). PELLICLE DISTORTION REDUCTION. Patent dated Jun. 13, 2006. Disclaimer filed Oct. 24, 2005 by the assignee, International Business Machines Corporation.

The term of this patent, subsequent to the term of patent number 6,731,378.

*(Official Gazette, August 1, 2006)*